US005760456A

United States Patent [19]

Grzegorek et al.

[11] Patent Number: 5,760,456

[45] Date of Patent: Jun. 2, 1998

[54] INTEGRATED CIRCUIT COMPATIBLE PLANAR INDUCTORS WITH INCREASED Q

[76] Inventors: Andrew Z. Grzegorek, 500 Curie Dr., San Jose, Calif. 95123; William J. McFarland, 1923 Barton St., Redwood City, Calif. 94061

[21] Appl. No.: 576,024

[22] Filed: Dec. 21, 1995

[51] Int. Cl.[6] .............................. H01L 29/00; H03H 7/00

[52] U.S. Cl. .......................... 257/531; 257/295; 257/258; 257/277; 257/278; 257/508; 257/758; 257/659; 333/172; 333/246

[58] Field of Search .................................... 257/295, 258, 257/277, 278, 508, 531, 758, 659; 333/172, 246

[56] References Cited

U.S. PATENT DOCUMENTS

| | | | |
|---|---|---|---|
| 5,015,972 | 5/1991 | Cygan et al. | 333/32 |
| 5,095,357 | 3/1992 | Andoh et al. | 357/51 |
| 5,384,274 | 1/1995 | Kanechachi | 437/47 |
| 5,446,311 | 8/1995 | Ewen et al. | 257/531 |
| 5,461,353 | 10/1995 | Eberhardt | 333/246 |

FOREIGN PATENT DOCUMENTS

| | | | |
|---|---|---|---|
| 55-91850 | 7/1980 | Japan | 257/531 |
| 56-125866 | 10/1981 | Japan | 257/531 |

*Primary Examiner*—Sara W. Crane
*Assistant Examiner*—Howard Weiss

[57] ABSTRACT

A planar inductor structure with improved Q compatible with typical integrated circuit fabrication. The structure includes a spiral inductor with a conductive plane between the resistive substrate of the integrated circuit and the spiral inductor which reduces the power loss of the inductor. A pattern of segments may be formed in the conductive material of conductive plane to prevent eddy currents from flowing through the conductive plane and reducing the inductance of the spiral inductor. The Q of the inductor can be enhanced by optimizing the pattern in which the segmented conductive plane is formed. The segmented conductive plane may be fabricated out of metal, polysilicon or a heavily-doped region of the substrate.

14 Claims, 8 Drawing Sheets

INTEGRATED CIRCUIT COMPATIBLE PLANAR INDUCTORS WITH INCREASED Q

FIELD OF INVENTION

This invention relates generally to planar inductors on integrated circuits. In particular, it relates to techniques for increasing the Q of the planar inductors.

BACKGROUND

It is desirable to have inductors that can be fabricated in an integrated circuit together with the electrical circuitry associated with the inductors. Electronic circuits can be manufactured less expensively and more reliably if all the elements of the circuitry are fabricated on a single integrated circuit. The number of integrated circuit input and output pins can be minimized by maximizing the number of types of electronic components that are included on the integrated circuit chip. Planar inductors have been successfully fabricated on integrated circuits but suffer from low Q's.

Many electronic circuits require inductors with a high Q. Specifically, communication devices that have a voltage controlled oscillator (VCO) may require a high-Q inductor. The Q of the inductor used in the tank circuit of the VCO directly effects the phase noise performance of the VCO. The phase noise performance of the VCO directly effects the ability of the communication device to receive and transmit modulated signals.

There is a demand for the capacity to incorporate high-Q inductors in integrated circuits. Electronic circuit manufacturers strive to minimize the number of electronic components required to manufacture the manufacturer's product. Presently, if an electronic circuit application requires a high Q inductor, the high Q inductor must be physically located external to the integrated circuit that comprises the rest of the associated electronic circuitry. This increases the cost of the electronic circuit and increases the manufacturing costs of the electronic product being produced. The electronic product will also tend to be physically larger and less reliable.

FIG. 1 shows a cross-section of a typical spiral inductor 12 formed on an integrated circuit 10. The spiral inductor 12 is fabricated from a layer of metal formed during the integrated circuit fabrication process. The first end 14 of the spiral inductor 12 is generally connected to a circuit trace on the same layer of metal as the spiral inductor 12. The second end 16 of the spiral inductor is generally connected through a via to a ground plane or to another circuit trace which resides on another layer of metal. The layers of metal are separated by the insulating layer 18.

FIG. 2 is an equivalent circuit depicting the spiral inductor 12 shown in FIG. 1 together with its associated parasitic capacitance, resistance and inductance.

The Q of an inductor is proportional to the energy stored in the inductor divided by the power dissipated in the inductor. The amount of energy stored in an inductor is directly proportional to the value of inductance of the inductor. The amount of power dissipated in an inductor depends on the resistive elements $R_S$, $R_{SUB}$, $R_{M1}$ and $R_{M2}$ associated with the inductor, as shown in FIG. 2.

The power dissipation in the spiral inductor 12 is generally dependent on three resistive loss components. The first resistive loss component is the resistance of the metal traces that form the spiral inductor 12. The second resistive loss component is the loss due to electric fields created when an alternating voltage applied to the spiral inductor 12 causes current to flow through the resistive substrate. The third resistive loss component is the loss due to magnetic fields created when an alternating current flows through the spiral inductor 12 inducing eddy currents to flow in the resistive substrate.

The spiral inductor 12 has an associated inductance ($L_0+L_{M1}+L_{M2}+\ldots$ in FIG. 2) and an ohmic series resistance ($R_S$ in FIG. 2). The $R_S$ series resistance component of the spiral inductor 12 primarily consists of the resistance of the metal traces that form the spiral inductor 12, but can also include the skin effect of the spiral inductor 12 when the frequency of current flowing through the spiral inductor 12 is relatively high.

The electric field resulting from the alternating voltage applied to the spiral inductor 12 causes current to flow through the resistive substrate 20. The substrate 20 is lossy and is more conductive than the insulating layer 18. The equivalent circuit of FIG. 2 depicts capacitive elements $C_{OX}$, $C_{SUB}$ representing the capacitance across the insulating layer 18 and the substrate layer 20. $R_{SUB}$ represents the resistive component of the lossy substrate 20. A voltage between the spiral inductor 12 and the substrate ground 22 will create an electric field across the insulation layer 18 and the substrate 20. If the voltage varies, the resulting changing electric field will cause current to flow through the substrate 20 charging and discharging the insulating layer capacitance $C_{OX}$. The magnitude of the current is directly proportional to the frequency at which the voltage varies. The substrate is resistive and will dissipate power. The power dissipation is proportional to the resistance of the substrate and to the square of the value of the current flowing through the resistive component $R_{SUB}$ of the substrate.

The magnetic field resulting from the alternating signal current flowing through the spiral inductor 12 induces eddy currents in the substrate 20. The eddy currents generate a magnetic field that opposes the magnetic field created by the current flowing through the spiral inductor 12. The eddy currents flowing in the resistive substrate 20 create a power loss which increases as the frequency of the signal current flowing through the spiral inductor 12 increases. The power loss can be modeled with a set of resistors $R_{M1}$ and $R_{M2}$ shunting inductor elements $L_{M1}$ and $L_{M2}$ of the spiral inductor 12. Increasing the frequency of the current flowing through the spiral inductor 12, increases the effect that the resistive elements $R_{M1}$ and $R_{M2}$ have on the inductive response. This decreases the Q of the spiral inductor 12.

$C_{FT}$ in FIG. 2 represents the feed through capacitance between the windings of the spiral inductor 12.

The substrate ground 22 of FIG. 1 is depicted as a conductive plane on the backside of an integrated circuit 10. However, different configurations of the substrate ground can provide the same basic functionality. The function of the substrate ground is to electrically connect the substrate 20 to a fixed low impedance potential. The grounding of the substrate 20 can be implemented by connecting the substrate to a fixed low impedance potential from the top side of the integrated circuit rather than to a ground plane on the bottom side of the substrate 20. The substrate may be connected to a fixed low impedance located at the top side of the integrated circuit by running a conductive tap through all of the top layers of the integrated circuit without making electrical contact with the layers the tap passes through. The conductive tap is configured so that the tap electrically connects the substrate 20 to the fixed low impedance potential.

There exists a need for inductors that can be formed on electronic integrated circuits that do not require any extra processing steps and that have higher values of Q than presently available.

SUMMARY OF THE INVENTION

The present invention discloses a planar spiral inductor structure formed on an integrated circuit which has higher values of inductor Q than presently available. The disclosed structure can be implemented during the fabrication of both CMOS and bipolar integrated circuits and does not require extra processing steps.

An embodiment of this invention is a planar inductor structure fabricated on integrated circuit. The structure includes a resistive substrate, a spiral inductor, a conductive layer located between the spiral inductor and the substrate, and a non-conductive layer for insulating the inductor from the conductive layer.

Another embodiment of the invention includes the conductive sheet having plural conductive segments and located to minimize eddy currents flowing through the conductive sheet. To minimize electric field loss the conductive sheet additionally includes a perimeter region electrically connected to a fixed low impedance reference voltage, and the conductive segments extend from the perimeter region toward a center portion of the planar inductor structure so that electric field current induced in the conductive sheet flows a minimized distance through the conductive sheet. Minimizing the electric field loss increases the Q of the spiral inductor.

Another embodiment of the invention includes a method of increasing the Q of an integrated circuit planar inductor structure. In the method, an integrated structure is provided including a substrate, a spiral inductor and an insulating layer between the substrate and the spiral inductor. A conductive layer is located between the substrate and the insulating layer. This embodiment may additionally include the conductive layer being segmented to minimize eddy currents flowing through the conductive layer. A fixed low impedance potential may be electrically connected to a perimeter region of the conductive layer, and the segmenting of the conductive layer may extend from the perimeter region towards a center portion of the planar inductor structure so that electric field current induced in the conductive sheet flows a minimized distance through the conductive sheet.

Other aspects and advantages of the present invention will become apparent from the following detailed description, taken in conjunction with the accompanying drawings, illustrating by way of example the principles of the invention.

DETAILED DESCRIPTION

Figure 1:
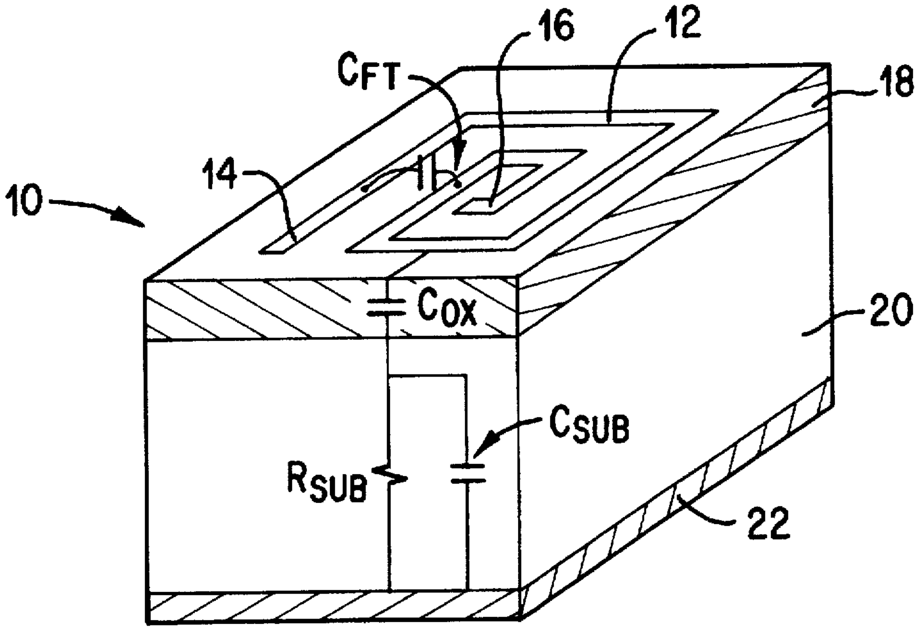
FIG. 1 PRIOR ART
FIG. 1 shows a cross-section perspective of a typical planar spiral inductor on an integrated circuit.

As shown in the drawings for purposes of illustration, the invention is embodied in the structure of a high-Q planar spiral inductor. The spiral inductor structure according to the invention enables a high-Q inductor to be fabricated in the same integrated circuit as the electronic circuit that requires the high-Q inductor. The benefits of a single integrated circuit chip solution include reduced cost, reduced physical size, increased reliability, ease of manufacturing, reduced power consumption and enhanced performance. These benefits are especially useful in the rapidly-expanding market for portable communication devices including portable telephones and radios.

Figure 3:
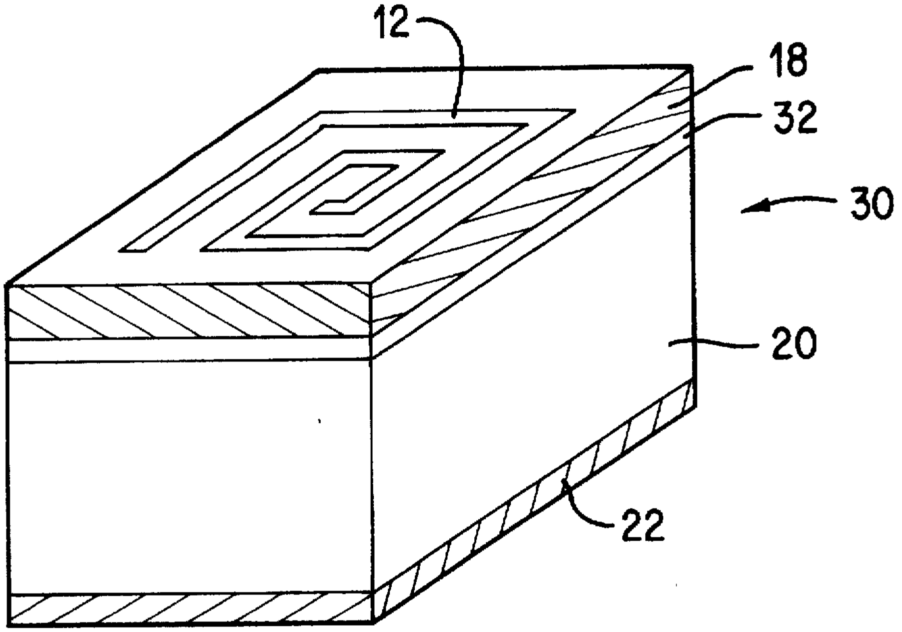
FIG. 3 shows a cross-section perspective of the planar spiral inductor according to the invention in which a conductive solid electrostatic shield is formed under the spiral inductor.

FIG. 3 shows a spiral inductor structure 30 according to the invention in which the substrate loss is greatly reduced by placing a solid conductive plane 32 between the spiral inductor 12 and the substrate 20 so that the current charging and discharging the oxide capacitance $C_{OX}$ does not flow through the lossy substrate 20. The electric field across the oxide layer 18 terminates at the solid conductive plane 32. The solid conductive plane 32 may be electrically connected to the substrate ground 22 or to another low impedance potential. The effect of the solid conductive plane 32 is to eliminate the resistance $R_{SUB}$ and to effectively replace $R_{SUB}$ with the low resistance path from the termination of the electric field on the conductive plane 32 to the substrate ground 22 or the low impedance potential. The low resistance path is discussed in greater detail later.

The solid conductive plane 32 has a conductivity several magnitudes greater than the conductivity of the substrate and is electrically connected to a fixed low impedance potential so that the current charging and discharging the oxide layer capacitance $C_{OX}$ flows through the conductive plane 32 rather than the substrate 20. The fixed low impedance potential is typically a user provided integrated circuit ground. As will be described in more detail below, the solid conductive plane 32 can be fabricated between the spiral inductor 12 and the substrate 20 without adding extra processing steps to presently existing integrated circuit fabrication processes. Therefore, the spiral inductor structure of this invention is easily and inexpensively incorporated into standard integrated circuit manufacturing processes.

Figure 2:
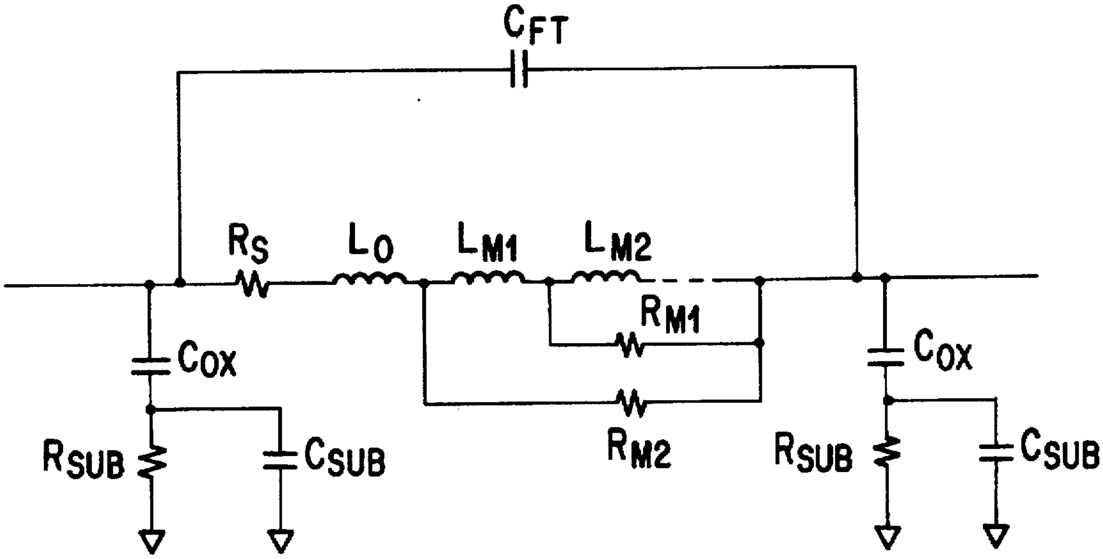
FIG. 2 PRIOR ART
FIG. 2 is an equivalent circuit of the planar spiral inductor shown in FIG. 1 and its parasitic circuit elements.
Figure 4:
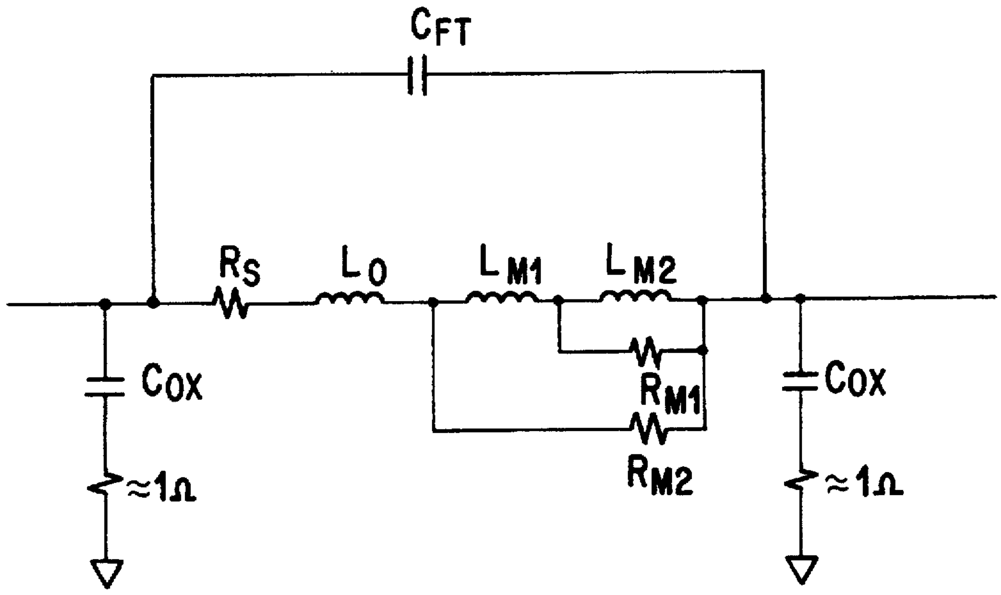
FIG. 4 is an equivalent circuit of the planar spiral inductor shown in FIG. 3 and its parasitic circuit elements.

FIG. 4 is an equivalent circuit of the spiral inductor 12 according to the invention in which the solid conductive plane 32 is located between the spiral inductor 12 the substrate 20. The resistance $R_{SUB}$ of FIG. 2 is not present in the equivalent circuit of the spiral inductor structure of this invention because of the electrostatic shielding provided by the solid conductive plane 32. Therefore, the spiral inductor structure of this invention can have a higher Q than previously possible.

The spiral inductor structure 12 of FIG. 3 can have a high-Q, but there are limitations on how close the solid conductive plane 32 can be to the spiral inductor 12. As shown is FIG. 5 in which the insulating layer 18 is omitted for clarity, an alternating current flowing through the spiral inductor 12 induces eddy currents 92 in the solid conductive plane 32. If the solid conductive plane 32 is too close to the spiral inductor 12, the eddy currents 92 become very effective at opposing and canceling the magnetic fields generated by the spiral inductor 12. Depending on the conductivity of the solid conductive plane 32 and its spacing from the spiral inductor 12, the eddy currents 92 can become so large as to reduce the value of inductance of the spiral inductor 12. The Q of an inductor is proportional to the value of the inductance of the inductor and inversely proportional to the resistance of the inductor. As a result, the increase in the Q of the spiral inductor 12 obtained by reducing $R_{SUB}$ can be canceled due to the reduced value of the inductance of the spiral inductor 12.

Figure 6:
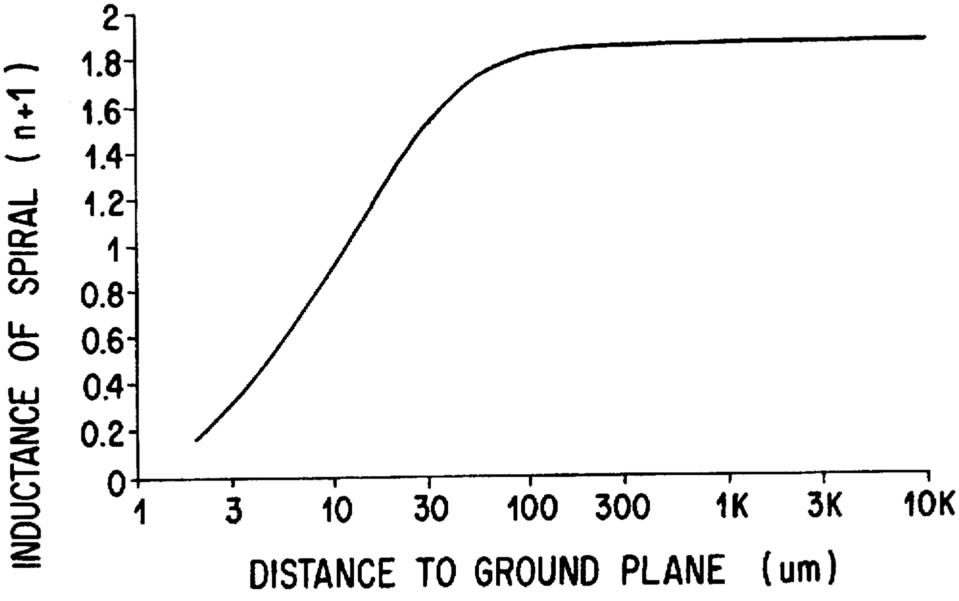
FIG. 6 is a plot which shows the variation in the inductance of the planar spiral inductor of FIG. 3 with the distance between the inductor and the solid conductive electrostatic shield.

FIG. 6 is a plot that depicts the variation in the spiral inductor 12 inductance value as a function of the distance between the spiral inductor 12 and the solid conductive plane 32 of FIG. 3. This plot shows that for a particular spiral inductor configuration the inductance value of the spiral inductor 12 begins to decrease when a solid conductive plane 32 is less than approximately 100 micrometers from the spiral inductor. With present integrated circuit fabrication processes, it is difficult to fabricate the conductive plane greater than 100 micrometers from the spiral inductor 12.

In addition to reducing the inductance of the spiral inductor 12, the solid conductive plane 32 located close to the spiral inductor 12 can significantly increase the value of the parasitic capacitance $C_{OX}$. This is undesirable because an increase in the parasitic capacitance associated with the spiral inductor 12 reduces the frequency range in which the inductor may be usefully operated.

Figure 7:
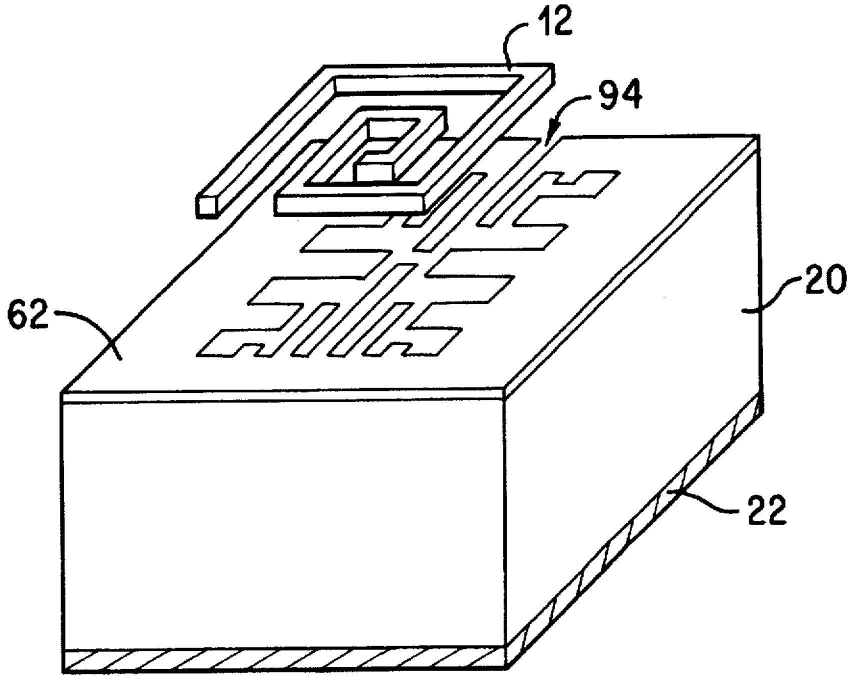
FIG. 7 shows a cross-section perspective view of another embodiment of this invention in which a segmented conductive electrostatic shield is located between the spiral inductor and the substrate.
Figure 8:
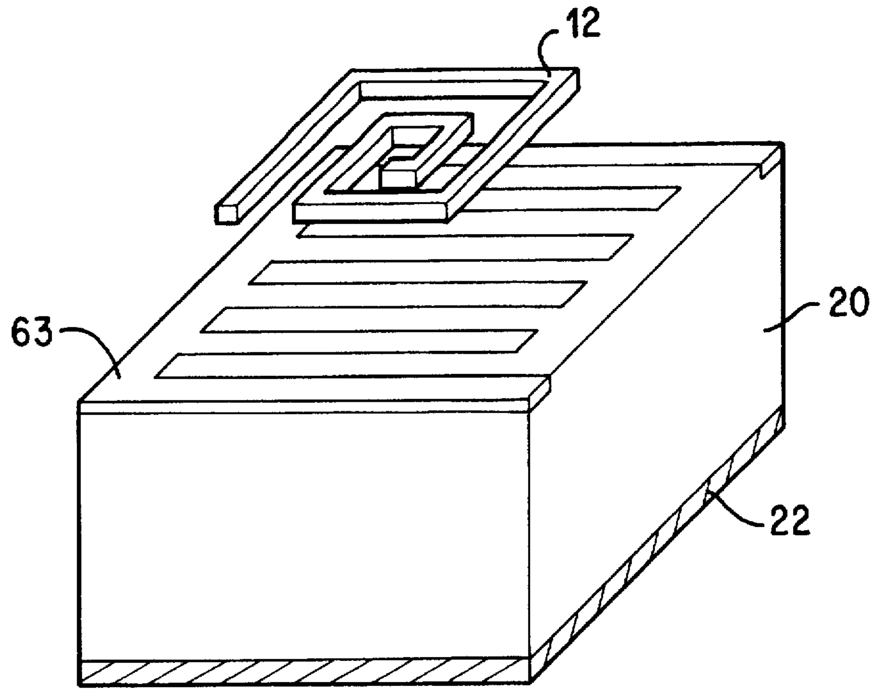
FIG. 8 shows a cross-section perspective view of another embodiment of this invention in which a segmented conductive electrostatic shield is located between the spiral inductor and the substrate.
Figure 9:
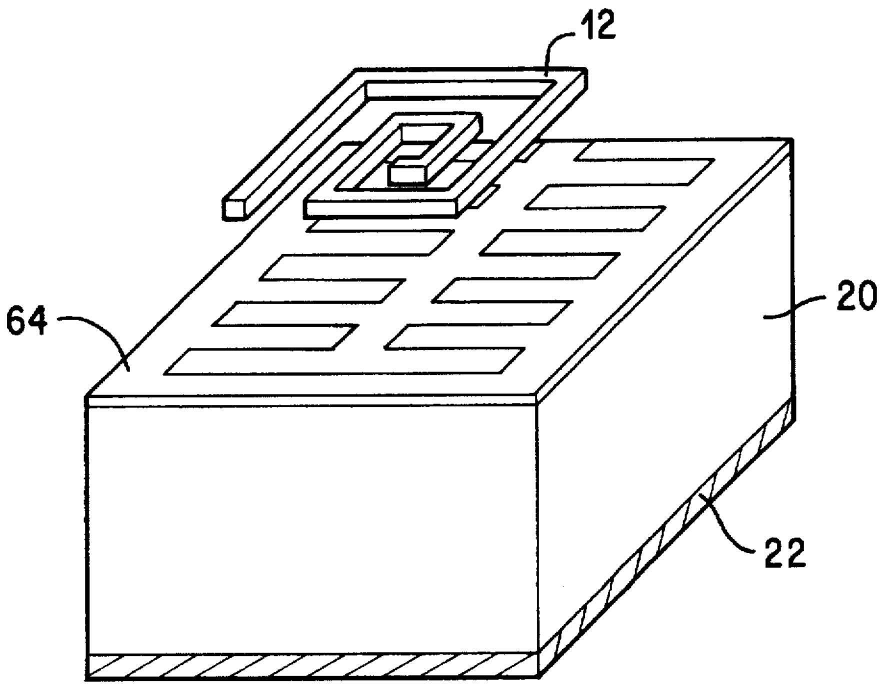
FIG. 9 shows a cross-section perspective view of another embodiment of this invention in which a segmented conductive electrostatic shield is located between the spiral inductor and the substrate.

FIGS. 7, 8, 9 show three different types of modifications to the conductive plane 32 in which the conductive plane is located between the spiral inductor 12 and the substrate, and the conductive plane is segmented. The oxide layer 18 has been omitted from the figures to aid in the depiction of the segmented conductive plane 62, 63 or 64. For illustrative purposes, the spiral inductor 12 is depicted as suspended above the segmented conductive plane 62, 63 or 64. The conductive material is segmented according to predetermined patterns that prevent significant eddy currents from flowing in the segmented conductive plane 62, 63 or 64. Preventing eddy currents from flowing in the segmented conductive plane 62, 63 or 64 reduces the effects of the close proximity of the segmented conductive plane 62, 63 or 64 on the inductance of the spiral inductor 12. However, the segmented conductive plane 62, 63 or 64 located between the spiral inductor and the lossy substrate will still electrostatically shield the spiral inductor from the lossy substrate. The segmented conductive plane 62, 63 or 64 effectively minimizes the effect of the substrate resistance without reducing the inductance of the spiral inductor. Therefore, the Q of the spiral inductor 12 is increased by including the segmented conductive plane 62, 63 or 64 in the spiral inductor 12 structure. With the segmented conductive plane 62, 63 or 64 located between the spiral inductor and the substrate, eddy currents still flow in the lossy substrate, but do not substantially effect the inductance value of the spiral inductor. The eddy currents flowing in each of the segmented conductive planes 62, 63 or 64 are substantially reduced in value by the segmenting patterns. However, the amount of electric field resistive loss can vary between the pattern configurations. The variance in electric field resistive loss between the segment configurations will be discussed later.

Figure 10:
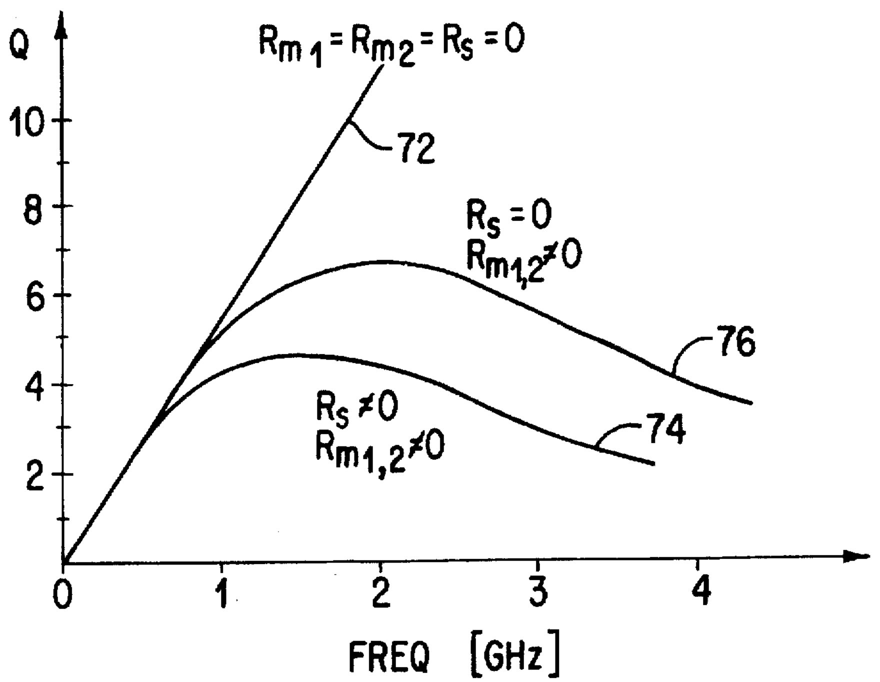
FIG. 10 is a plot of Q as a function of frequency for an ideal spiral inductor, a prior art spiral inductor structure and the spiral inductor structure of this invention.

FIG. 10 is a plot that depicts the values of Q for a particular spiral inductor fabricated adjacent a substrate as a function of frequency for several different configurations. A first curve 72 represents the Q of an ideal spiral inductor which has no associated electric or magnetic field losses ($R_{M1}=R_{M2}=R_S=0$ ohms). A second curve 74 represents the Q of a spiral inductor as shown in FIG. 1 which has both electric and magnetic field losses. A third curve 76 represents the Q of a spiral inductor structured as described by this invention in which the electric field loss has been reduced by a segmented conductive plane located between the spiral inductor and the lossy substrate.

Figure 11:
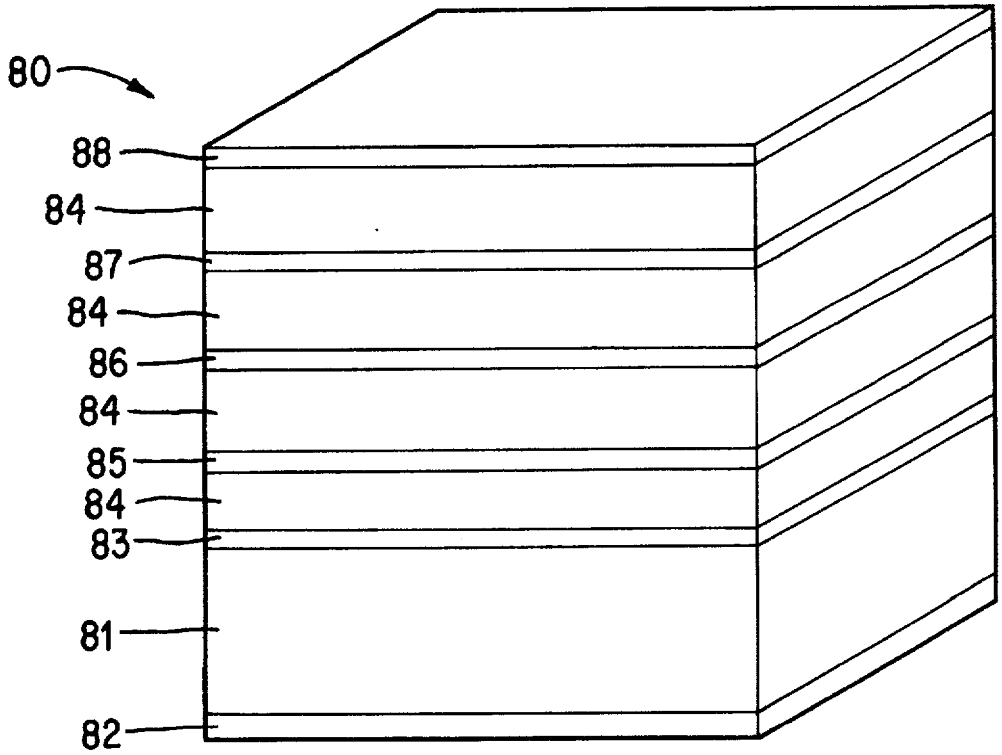
FIG. 11 shows a cross-section perspective of a typical integrated circuit showing the conductive layers that may be used to form an electrostatic shield.

FIG. 11 shows a cross-section perspective view of a typical integrated circuit structure 80 in which a spiral inductor may be fabricated. The structure includes a resistive substrate 81 with a conductive layer 82 on its bottom surface. On the top surface of the resistive substrate 81 exists a doping region layer 83 which is conductive and can be formed by heavily doping the top surface of the resistive substrate 81. The segmented conductive plane can be fabricated out of the doping region layer 83 by selectively doping the top surface of the resistive substrate 18 to provide the desired shape of the segmented conductive plane. The processes used to selectively dope the top surface of the resistive substrate 18 to fabricate the segmented conductive plane are the same processes used to selectively dope the top surface of the resistive substrate 81 when fabricating active and passive semiconductor devices such as transistors, diodes and resistors. The fabrication of active and passive devices on a resistive substrate is a process that is well understood and is a processing step in the fabrication of essentially all integrated circuits. Above the doping region 83 is a first insulating layer 84. The insulating layer 84 may comprise a non-conductive oxide. Above the first insulating layer 84 is a polysilicon layer 85. The conductive plane can be formed in the polysilicon layer 85 by masking and etching the polysilicon layer as the polysilicon layer is fabricated. Above the polysilicon layer is another insulating layer 84. The next layer is a first metalization layer 86. The segmented conductive plane can be formed in the first metalization layer 86 by masking the first metalization layer 86 after it is formed with a photoresist. The metalization layer 86 with photoresist is exposed to light and then etched to form the patterns. This procedure is the same as is presently used to form patterns in metalization layers when creating the electrical interconnections between devices on an integrated circuit. The conductive plane can alternatively be formed by selectively depositing the first metalization layer 86 in the desired pattern. Above the first metalization layer 86 is another insulating layer 84. The next layer is a second metalization layer 87. The second metalization layer 87 can be used to form a connection trace to one end of the spiral inductor if the spiral inductor is not connected to ground. Above the second metalization layer is another insulating layer 84. The top layer is a third metalization layer 88 in which a spiral inductor 12 can be formed.

A conductive plane can be formed in the doping region layer 83, the polysilicon layer 85 or the first metalization layer 86. The closer the conductive plane is formed to the spiral inductor, the more parasitic capacitance there is associated with the spiral inductor. Typically, the doping region layer 83 is the layer that is the farthest from the spiral inductor. However, the doping region layer 83 is more resistive than the metalization layer 86 or the polysilicon layer 85. The polysilicon layer 85 is more resistive than the metalization layer 86. As the resistivity of the segmented conductive plane increases, the electrostatic shielding that the segmented conductive plane provides becomes less effective and the electric field loss increases. Electric field loss translates into a reduction in the Q of the spiral inductor. Therefore, a tradeoff exists between spiral inductor loss and spiral inductor capacitance depending on the layer selected as the segmented conductive plane and the distance between the spiral inductor and the segmented conductive plane.

Figure 5:
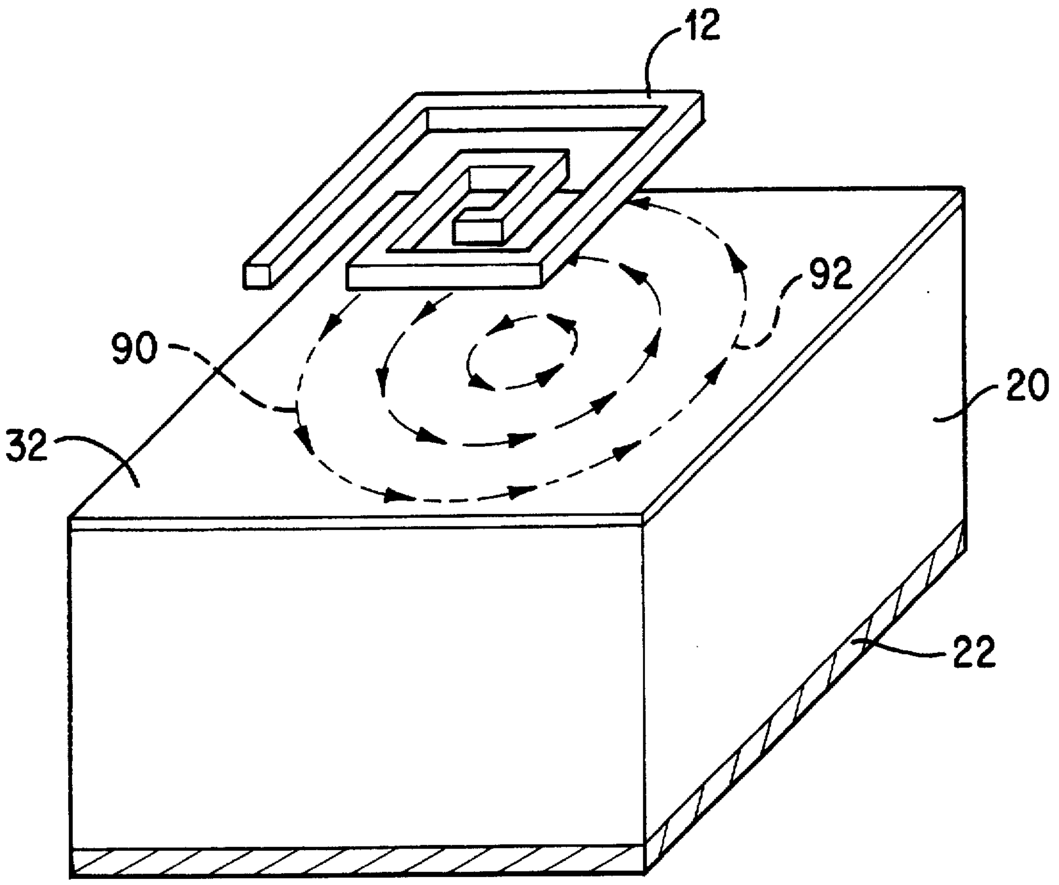
FIG. 5 shows the eddy current paths induced in a solid conductive plane adjacent to the spiral inductor.

The segmented conductive plane 62 should be configured to minimize the eddy currents flowing through the segmented conductive plane when the spiral inductor 12 is conducting an alternating current. FIG. 5 shows the paths in which eddy currents 92 induced by the alternating current flow in the solid conductive plane 32. FIG. 7 shows a segmented conductive plane 62 in which the magnitude of the eddy currents is reduced significantly by segmenting the conductive plane. The segmenting increases the resistance of the conductive plane to eddy currents 92 flowing in the direction as shown in FIG. 5. This is accomplished by forming the segment pattern so that there are no conductive paths around the surface area of the conductive plane in the direction as indicated by the eddy currents 92 of FIG. 5. As shown in FIG. 7, a gap 94 must exist in the segmented conductive plane 62 to prevent the existence of the conductive paths.

Figure 12:
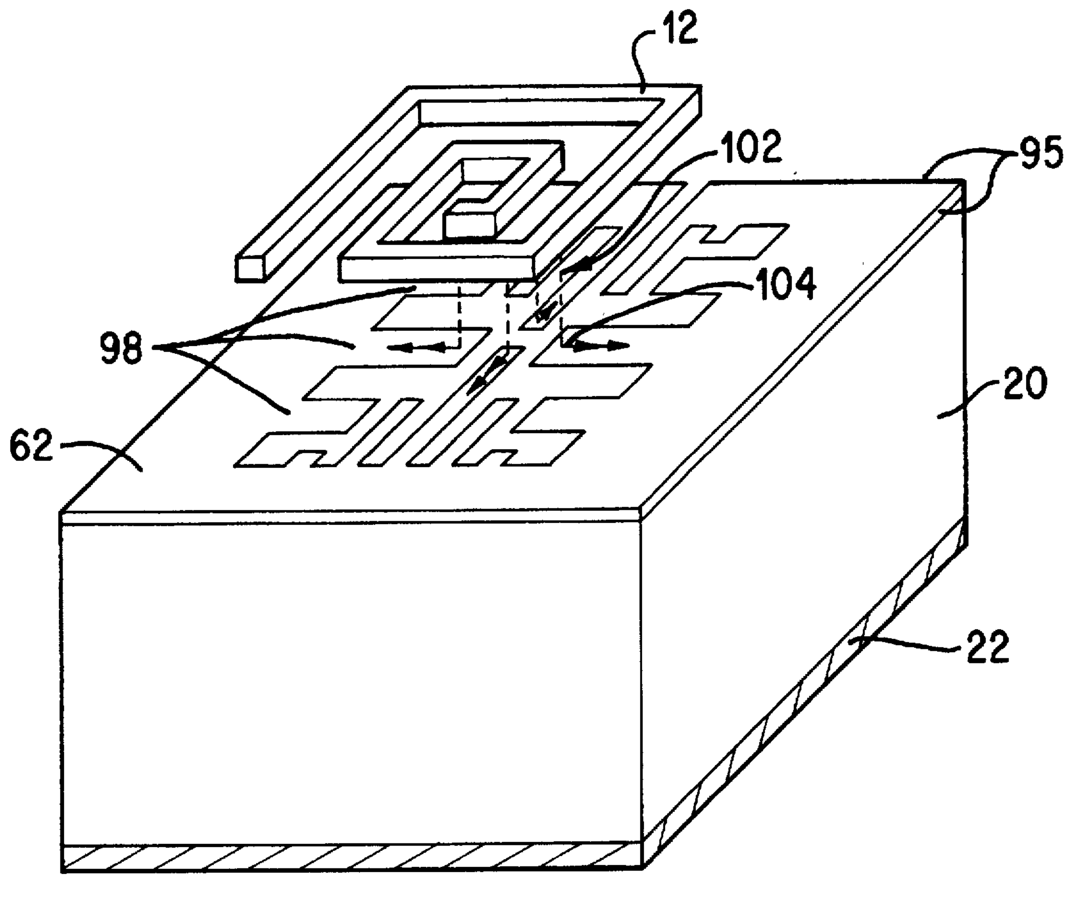
FIG. 12 shows the paths of the electric field lines emanating from the spiral inductor.

An alternating potential on the spiral inductor 12 will create an alternating electric field from the spiral inductor 12 to the conductive plane 62. FIG. 12 shows the path of electric fields lines 102 emanating from the spiral inductor 12. The electric field lines 102 emanating from the spiral inductor will terminate at the nearest conductive material. Therefore, electric field lines 102 emanating from the spiral inductor 12 will terminate at the segmented conductive plane 62. Current 104 flows from the termination points of the electric field lines 102 to a fixed low impedance reference voltage electrically connected to the segmented conductive plane 62. The electric field loss can be minimized by reducing the resistive path of the segmented conductive plane 62 in which the current 104 flows from the termination point of the electric field to the fixed low impedance potential of the integrated circuit. This can be accomplished by minimizing the amount of conductive surface distance that the electric field induced current 104 flows. The longer the distance of conductive plane 62 through which the induced current 104 flows, the greater the electric field loss component of the spiral inductor 12. The outside edges 95 of the conductive plane 62 are at a potential very close to the fixed low impedance reference potential of the integrated circuit. To minimize the average conductive path distance between the outside edges of the conductive plane 62 and the termination points of the electric field lines 102 on the conductive plane 62, the conductive plane 62 is fabricated following a pattern in which the conductive plane 62 comprises a multiple of conductive plane fingers 98. The conductive plane fingers 98 extend from the edges of the conductive plane towards the center of the planar inductor structure. The pattern of the conductive plane 62 shown in FIG. 12 has been simplified for depiction.

The segmented conductive plane 62 of FIG. 7 has less electric field resistive loss than the segmented conductive plane 63 of FIG. 8 or the segmented conductive plane 64 of FIG. 9. This is because the average distance between the electric field termination points and the outside edges of the segmented conductive plane 62 of FIG. 7 is less than the average distance between the electric field termination points and the outside edges of the segmented conductive plane 63 of FIG. 8 or the segmented conductive plane 64 of FIG. 9.

Figure 13:
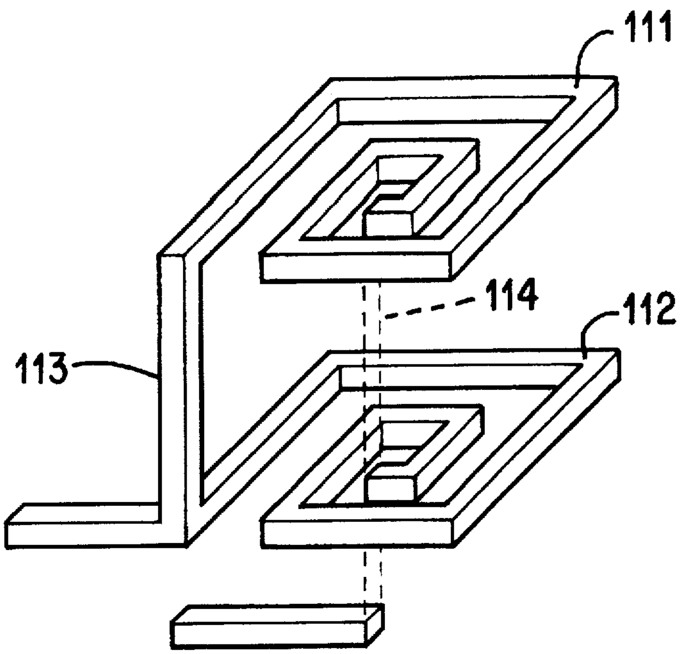
FIG. 13 shows a planar inductor formed by electrically connecting two spiral inductors in parallel where each spiral inductor resides on a unique conductive layer within an integrated circuit.
Figure 14:
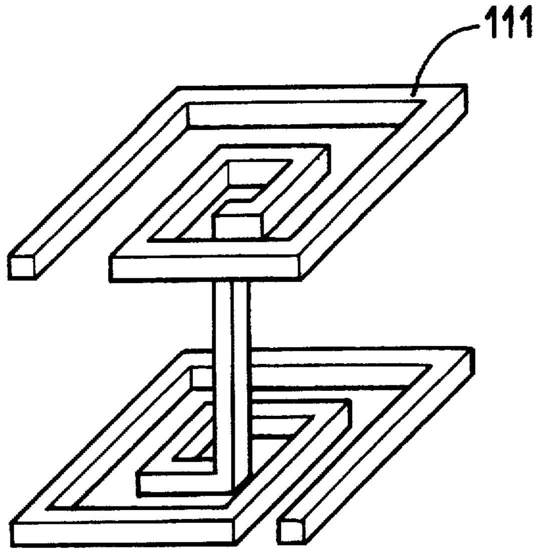
FIG. 14 shows a planar inductor formed by electrically connecting two spiral inductors in series where each spiral inductor resides on a unique conductive layer within an integrated circuit.

A single inductor can be fabricated by electrically connecting more than one spiral inductor together. The spiral inductors can be formed on different conductive layers of the integrated circuit. FIG. 13 shows two spiral inductors 111, 112 which are electrically connected by a first via 113 and a second via 114. The vias 113, 114 generally pass through an insulating oxide. An advantage to providing an inductor by connecting two separate spiral inductors includes a reduction in the series resistance of the useable inductor. If the two spiral inductors are formed so that the spiral inductors are connected in parallel, the series resistance of the combination will be less than the series resistance of the individual spiral inductors. This can yield an inductor with less series resistance than a similarly constructed inductor having half the inductance. FIG. 14 shows an inductor formed by connecting two spiral inductors that reside on two different layers in series. With this structure, an inductor can be formed having a greater number of turns within a smaller amount of integrated circuit chip surface area. By minimizing the surface area of the inductor, the series resistance of the inductor can be minimized.

Although specific embodiments of the invention have been described and illustrated, the invention is not to be limited to the specific forms or arrangements of parts so described and illustrated. The invention is limited only by the claims.

We claim:

1. An integrated circuit planar inductor structure comprising:

a resistive substrate;

a spiral inductor;

a conductive layer located between the spiral inductor and the substrate, the conductive layer including plural conductive segments, the conductive layer located to minimize eddy currents flowing through the conductive layer, the conductive layer including a perimeter region electrically connected to a fixed low impedance reference voltage, the conductive segments extending from the perimeter region toward a center portion of the planar inductor structure so that electric field current induced in the conductive layer flows a minimized distance through the conductive layer; and means for insulating the spiral inductor from the conductive layer.

2. A method of increasing the Q of an integrated circuit planar inductor structure, the method comprising the steps of:

providing an integrated structure including a substrate, a spiral inductor and an insulating layer between the substrate and the spiral inductor;

interposing a conductive layer between the substrate and the insulating layer.

segmenting the conductive layer;

providing a fixed low impedance potential electrically connected to a perimeter region of the conductive layer; and extending the segmenting of the conductive layer from the perimeter region towards a center portion of the planar inductor structure.

3. An integrated circuit planar inductor structure comprising:

a resistive substrate;

a spiral inductor;

a conductive layer located between the spiral inductor and the substrate, the conductive layer including a perimeter region electrically connected to a fixed low impedance reference voltage;

means for insulating the spiral inductor from the conductive layer.

4. The planar inductor structure as recited in claim 3, wherein the conductive layer includes plural conductive segments and located to minimize eddy currents flowing through the conductive layer.

5. The planar inductor structure as recited in claim 4, wherein the conductive segments extend from the perimeter region toward a center portion of the planar inductor structure so that electric field current induced in the conductive layer flows a minimized distance through the conductive layer.

6. The planar inductor structure as recited in claim 3, wherein the conductive layer comprises metal.

7. The planar inductor structure as recited in claim 3, wherein the conductive layer comprises polysilicon.

8. The planar inductor structure as recited in claim 3, wherein the conductive layer comprises a heavily-doped region of the substrate.

9. The planar inductor structure as recited in claim 3, wherein the spiral inductor comprises a first part on a first metalization layer and a second part on a second metalization layer wherein the first part and the second part are electrically connected.

10. The planar inductor structure as recited in claim 9, wherein the first part and the second part are connected in parallel.

11. The planar inductor structure as recited in claim 9, wherein the first part and the second part are connected in series.

12. A method of increasing the Q of an integrated circuit planar inductor structure, the method comprising the steps of:

providing an integrated structure including a substrate, a spiral inductor and an insulating layer between the substrate and the spiral inductor;

interposing a conductive layer between the substrate and the insulating layer; and providing a fixed low impedance potential electrically connected to a perimeter region of the conductive layer.

13. The method of claim 12, additionally comprising a step of segmenting the conductive layer.

14. The method of claim 13, additionally comprising the steps of:

extending the segmenting of the conductive layer from the perimeter region towards a center portion of the planar inductor structure.

* * * * *